(12) United States Patent
Tao et al.

(10) Patent No.: US 7,253,529 B2
(45) Date of Patent: *Aug. 7, 2007

(54) MULTI-CHIP PACKAGE STRUCTURE

(75) Inventors: Su Tao, Kaoshiung (TW); Yu-Fang Tsai, Kaoshiung (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 19 days.

This patent is subject to a terminal disclaimer.

(21) Appl. No.: 11/026,797

(22) Filed: Dec. 31, 2004

(65) Prior Publication Data

US 2005/0140022 A1 Jun. 30, 2005

(30) Foreign Application Priority Data

Dec. 31, 2003 (TW) ............................ 92137630 A
Jun. 30, 2004 (TW) ............................ 93119671 A (51) Int. Cl.
H01L 23/48 (2006.01)
H01L 23/52 (2006.01)
H01L 29/40 (2006.01)

(52) U.S. Cl. ................... 257/777; 257/686; 257/787; 257/706; 257/E25.013

(58) Field of Classification Search ........ 257/685–687, 257/706, 777, 787–796, 707, E25.013
See application file for complete search history.

(56) References Cited

U.S. PATENT DOCUMENTS

2004/0056277 A1  3/2004  Karnezos
2004/0061212 A1  4/2004  Karnezos
2004/0061213 A1  4/2004  Karnezos
2004/0063242 A1* 4/2004  Karnezos ............... 438/106
2004/0063246 A1  4/2004  Karnezos
2004/0065963 A1  4/2004  Karnezos
2004/0113253 A1  6/2004  Karnezos
2004/0113254 A1  6/2004  Karnezos (Continued)

OTHER PUBLICATIONS

American Heritage Dictionary Online, www.bartleby.com.*
Peter Van Zant, Microchip Fabrication, 2000, McGraw-Hill, Fourth Edition, p. 542.*
Charles A. Harper, Electronic Packaging and Interconnection Handbook, 2000, McGraw-Hill, Third Edition, p. 7.80.*

*Primary Examiner*—Monica Lewis
(74) *Attorney, Agent, or Firm*—SeyfarthShaw LLP (57) ABSTRACT

The present invention relates to a multi-chip package structure, comprising a first substrate, a first chip, a sub-package and a first molding compound. The first chip is attached to the first substrate. The first molding compound encapsulates the first chip, the sub-package and the top surface of the first substrate. The bottom surface of the sub-package is attached to the first chip. The sub-package comprises a second substrate, a second chip and a second molding compound. The second substrate has a top surface and a bottom surface, and is electrically connected to the first chip. The second chip is attached to the top surface of the second substrate to which the second chip is electrically connected. The second molding compound encapsulates the second chip and part of the top surface of the second substrate. Whereby, the relative large area caused by the parallel arrangement of a plurality of conventional package structures can be reduced, and there is no need to redesign signal-transmitting path.

12 Claims, 6 Drawing Sheets

U.S. PATENT DOCUMENTS

2004/0113255 A1 6/2004 Karnezos
2004/0113275 A1 6/2004 Karnezos
2004/0119152 A1 6/2004 Karnezos
2004/0119153 A1 6/2004 Karnezos
2004/0124518 A1 7/2004 Karnezos
2005/0133916 A1 6/2005 Karnezos
2006/0131717 A1* 6/2006 Tao et al. .................. 257/686

* cited by examiner

MULTI-CHIP PACKAGE STRUCTURE

BACKGROUND OF THE INVENTION

1. Field of the Invention

The present invention relates to a multi-chip package structure, particularly to a multi-chip package structure having a sub-package.

2. Description of the Related Art

The requirement of high density, high performance and precise cost control from, an electronic product speeds up the developments of System On a Chip (SOC) and System In a Package (SIP). The mostly used package technique is Multi-Chip Module (MCM), which integrates the chips having different functions, such as microprocessors, memories, logic elements, optical ICs and capacitors, and replaces the prior art of disposing individual packages on one circuit board.

Figure 1:
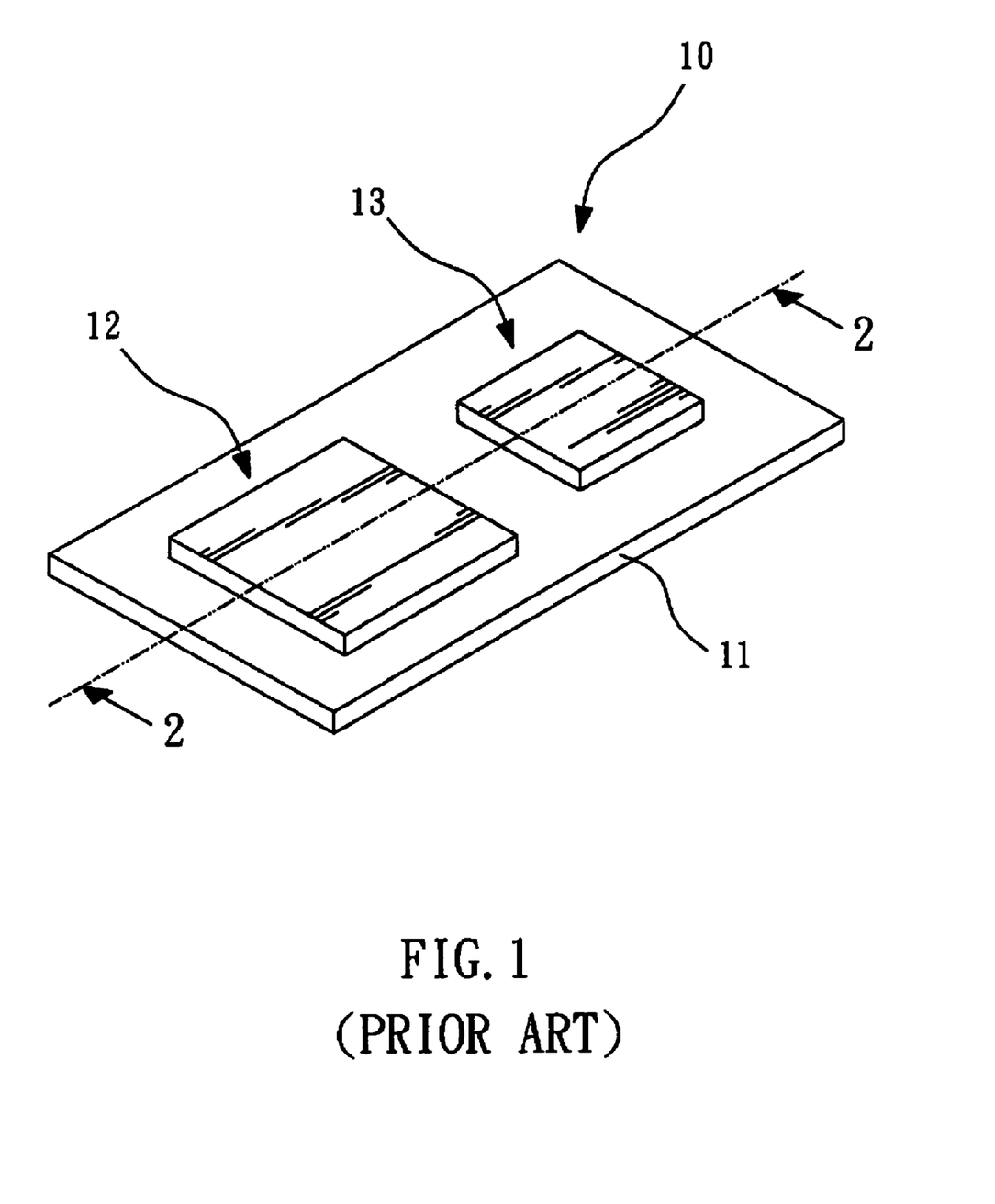
FIG. 1 shows a perspective view of a conventional Multi-Chip Module package structure.
Figure 2:
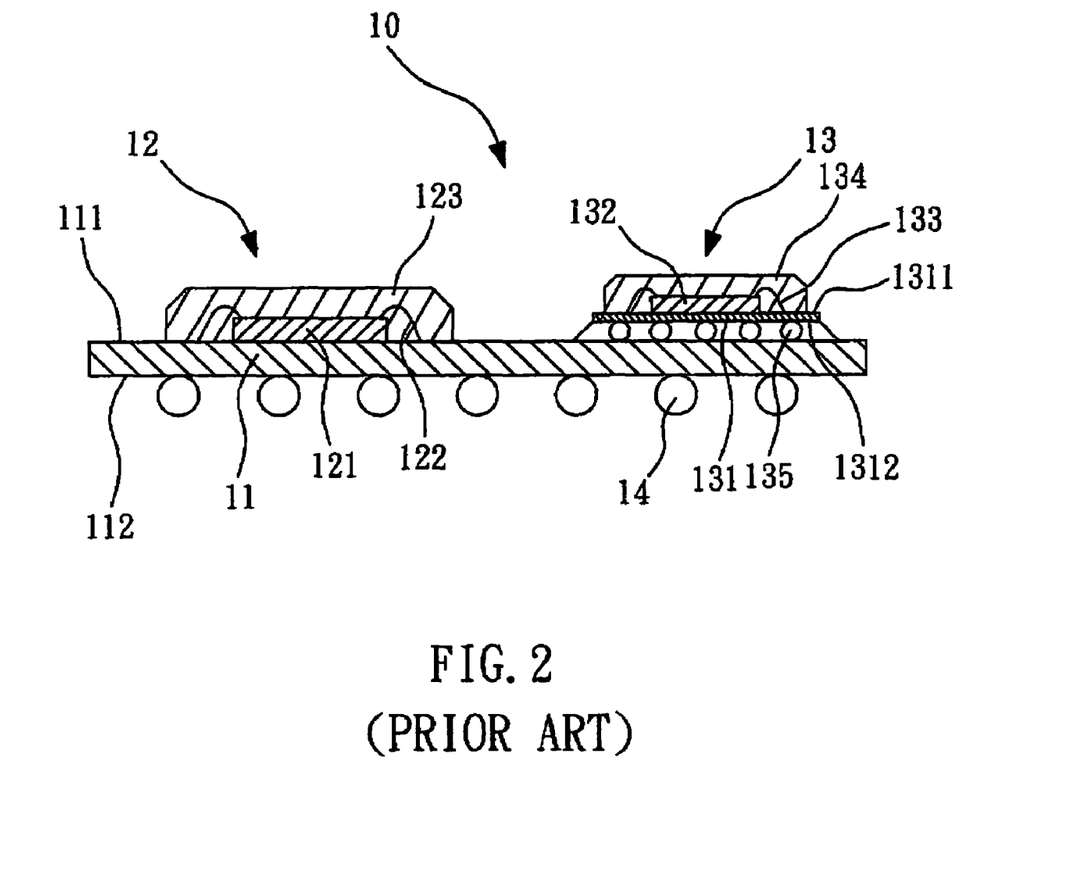
FIG. 2 shows a cross-sectional view of a conventional Multi-Chip Module package structure along line 2-2 of FIG. 1.

FIGS. 1 and 2 show the perspective and cross-sectional views of a conventional Multi-Chip Module package structure, respectively. The conventional Multi-Chip Module package structure 10 comprises a first substrate 11, a first package structure 12, a second package structure 13 and a plurality of first solder balls 14.

The first substrate 11 has a top surface 111 and a bottom surface 112. The first solder balls 14 are formed on the bottom surface 112 of the first substrate 11. The first package structure 12 comprises a first chip 121, a plurality of first wires 122 and a first molding compound 123. The first chip 121 is adhered to the top surface 111 of the first substrate 11, and is electrically connected to the first substrate 11 by utilizing the first wires 122. The first molding compound 123 encapsulates the first chip 121, the first wires 122 and part of the top surface 111 of the first substrate 11.

The second package structure 13 comprises a second substrate 131, a second chip 132, a plurality of second wires 133, a second molding compound 134 and a plurality of second solder balls 135. The second substrate 131 has a top surface 1311 and a bottom surface 1312. The second chip 132 is adhered to the top surface 1311 of the second substrate 131, and is electrically connected to the second substrate 131 by utilizing the second wires 133. The second molding compound 134 encapsulates the second chip 132, the second wires 133 and part of the top surface 1311 of the second substrate 131. The second solder balls 135 are formed on the bottom surface 1312 of the second substrate 131. The second package structure 13 is attached to the top surface 111 of the first substrate 11 by surface mounting that utilizes the second solder balls 135 after the second package structure 13 itself has been packaged.

In the conventional Multi-Chip Module package structure 10, the first chip 121 is a microprocessor chip, and the second chip 132 is a memory chip. Because different memory chips have different sizes and different amounts of I/O pins, it is necessary to redesign signal-transmitting path when the microprocessor chip is integrated with different memory chips, which increases the manufacture cost and extends the research time. Additionally, in the conventional Multi-Chip Module package structure 10, the first package structure 12 and the second package structure 13 are disposed in parallel relationship, which occupies a relative large area.

Consequently, there is an existing need for a novel and improved multi-chip package structure to solve the above-mentioned problem.

SUMMARY OF THE INVENTION

One objective of the present invention is to provide a package structure having a sub-package therein. The package structure of the present invention is formed by stacking so as to avoid the shortcoming of large area caused by parallel arrangement of a plurality of conventional package structures.

Another objective of the present invention is to provide a package structure having a sub-package therein. The package structure of the present invention has at least two chips; therefore, there is no need to redesign the signal-transmitting path between the chips.

Yet another objective of the present invention is to provide a multi-chip package structure comprising a first substrate, a first chip, a sub-package and a first molding compound.

The first substrate has a top surface and a bottom surface. The first chip is attached to the top surface of the first substrate and is electrically connected to the first substrate. The sub-package has a top surface and a bottom surface, wherein the bottom surface of the sub-package is attached to the first chip.

The sub-package includes a second substrate, a second chip and a second molding compound. The second substrate has a top surface and a bottom surface and is electrically connected to at least one of the first substrate and the first chip. The second chip is attached to the top surface of the second substrate and is electrically connected to the second substrate. The second molding compound is used for encapsulating the second chip and part of the top surface of the second substrate.

The first molding compound is used for encapsulating the first chip, the sub-package and the top surface of the first substrate.

DETAILED DESCRIPTION OF THE INVENTION

Figure 3:
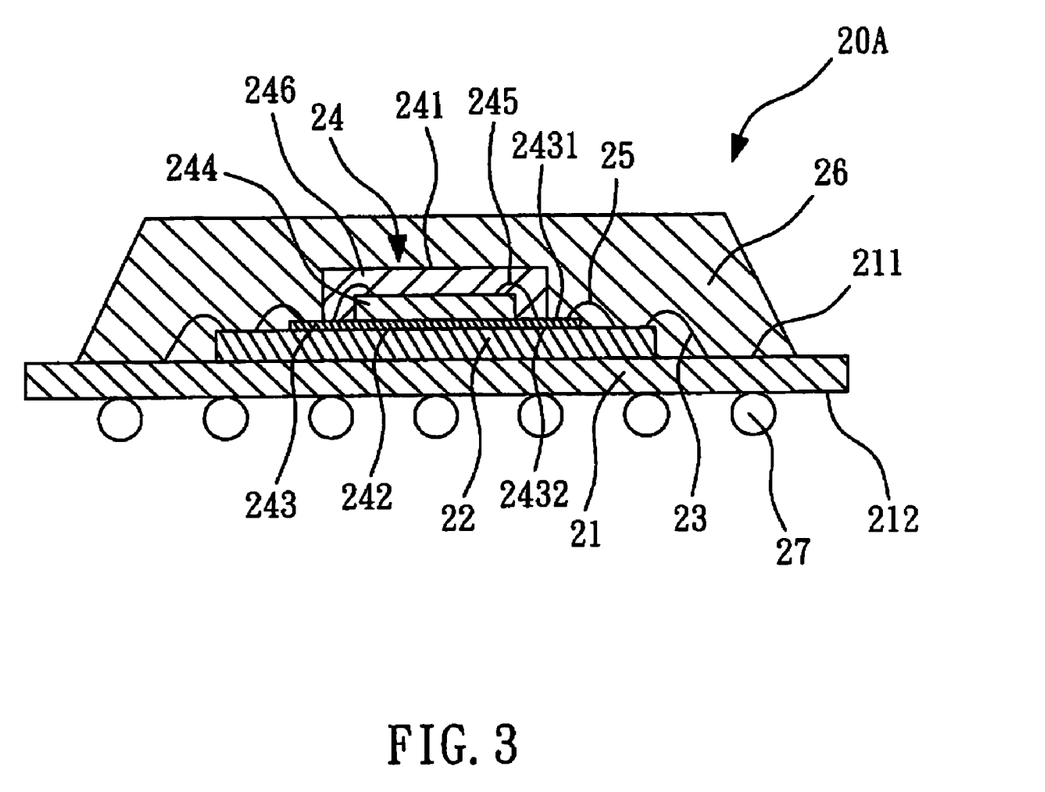
FIG. 3 shows a cross sectional view of a multi-chip package structure according to the first embodiment of the present invention.

FIG. 3 shows a cross sectional view of a multi-chip package structure according to the first embodiment of the present invention. The multi-chip package structure 20A of the embodiment comprises a first substrate 21, a first chip 22, a plurality of first wires 23, a sub-package 24, a plurality of third wires 25, a first molding compound 26 and a plurality of solder balls 27.

The first substrate 21 has a top surface 211 and a bottom surface 212. The first chip 22 is attached to the top surface 211 of the first substrate 21 and is electrically connected to the first substrate 21 by utilizing the first wires 23. It is to be noted that if the first chip 22 is attached to the first substrate 21 by flip-chip, there is no need to dispose the first wires 23.

The sub-package 24 has a top surface 241 and a bottom surface 242. The bottom surface 242 of the sub-package 24 is attached to the first chip 22 by utilizing adhesive glue. The sub-package 24 includes a second substrate 243, a second chip 244, a plurality of second wires 245 and a second molding compound 246.

The second substrate 243 has a top surface 2431 and a bottom surface 2432 and is electrically connected to the first chip 22 by utilizing the third wires 25 or electrically connected to the first substrate 21 by utilizing the third wires 25 (not shown). The second chip 244 is attached to the top surface 2431 of the second substrate 243 and is electrically connected to the second substrate 243 by utilizing the second wires 245. The second molding compound 246 is used for encapsulating the second chip 244 and part of the top surface 2431 of the second substrate 243. It is to be noted that the second molding compound 246 does not cover the entire top surface 2431 of the second substrate 243. There are a plurality of pads (not shown) disposed on the portion of the top surface 2431 of the second substrate 243 that is not covered by the second molding compound 246 so as to be electrically connected to the third wires 25.

The sub-package 24 is selected from a group consisting of Land Grid Array (LGA) package, Quad Flat Non-leaded (QFN) package, Small Outline Non-leaded (SON) package and Chip On Film package. In this embodiment, the sub-package 24 is a Land Grid Array package whose bottom surface 2432 has a plurality of landing pads for testing. Therefore, the sub-package 24 is adhered to the first chip 22 after being tested so as to raise the yield rate of the multi-chip package structure 20A.

The first molding compound 26 is used for encapsulating the first chip 22, the sub-package 24, the first wires 23, the third wires 25 and the top surface 211 of the first substrate 21. The solder balls 27 are formed on the bottom surface 212 of the first substrate 21 so as to be electrically connected to an outer circuit.

The first chip 22 and the second chip 244 may be optical chip, logic chip, microprocessor chip or memory chip. In this embodiment, the first chip 22 is a microprocessor chip, and the second chip 244 is a memory chip.

Figure 4:
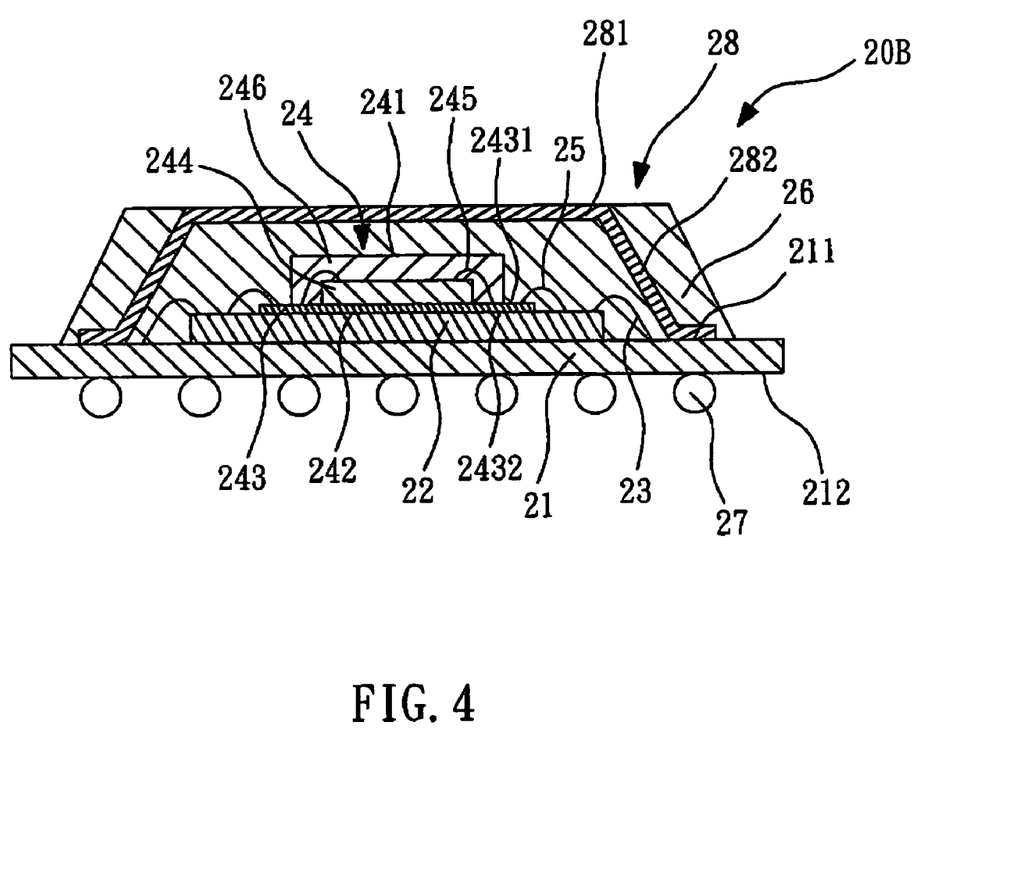
FIG. 4 shows a cross sectional view of a multi-chip package structure according to the second embodiment of the present invention.

FIG. 4 shows a cross sectional view of a multi-chip package structure according to the second embodiment of the present invention. The multi-chip package structure 20B of the embodiment is substantially equal to that of the first embodiment, except that a heat spreader 28 is added in the embodiment. The heat spreader 28 comprises a heat spreader body 281 and a supporting portion 282, wherein the supporting portion 282 extends outwardly and downwardly from the heat spreader body 281 so as to support the heat spreader body 281. The top surface of the heat spreader body 281 is exposed to the air after being encapsulated so as to increase heat dissipation efficiency.

Figure 5:
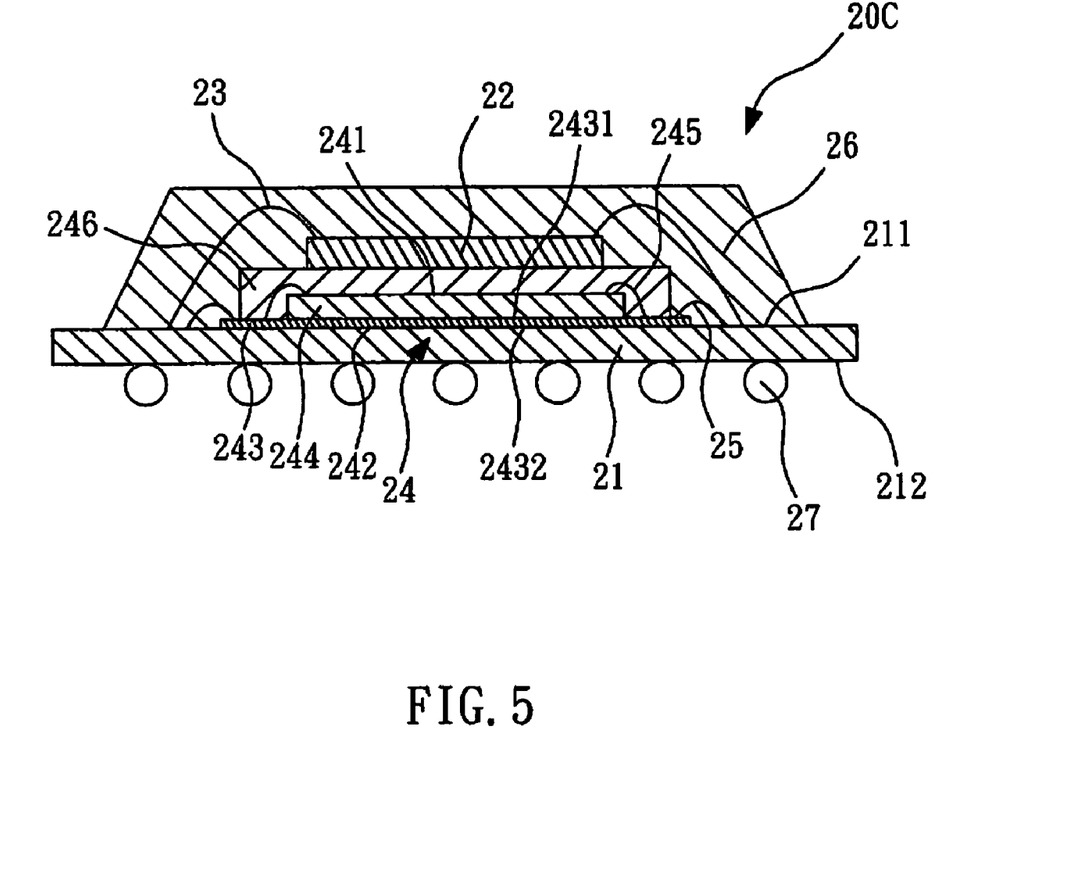
FIG. 5 shows a cross sectional view of a multi-chip package structure according to the third embodiment of the present invention.

FIG. 5 shows a cross sectional view of a multi-chip package structure according to the third embodiment of the present invention. The multi-chip package structure 20C of the embodiment is substantially equal to that of the first embodiment, except that the first chip 22 and the sub-package 24 are transposed. That is, the first chip 22 is disposed on the top surface 241 of the sub-package 24, and the bottom surface 242 of the sub-package 24 is adhered to the top surface 211 of the first substrate 21. Additionally, in this embodiment, the third wires 25 electrically connect the top surface 2431 of the second substrate 243 and the top surface 211 of the first substrate 21. Alternatively, the third wires 25 may electrically connect the first chip 22 and the first substrate 21, or the third wires 25 may electrically connect the first chip 22 and the second substrate 243.

Figure 6:
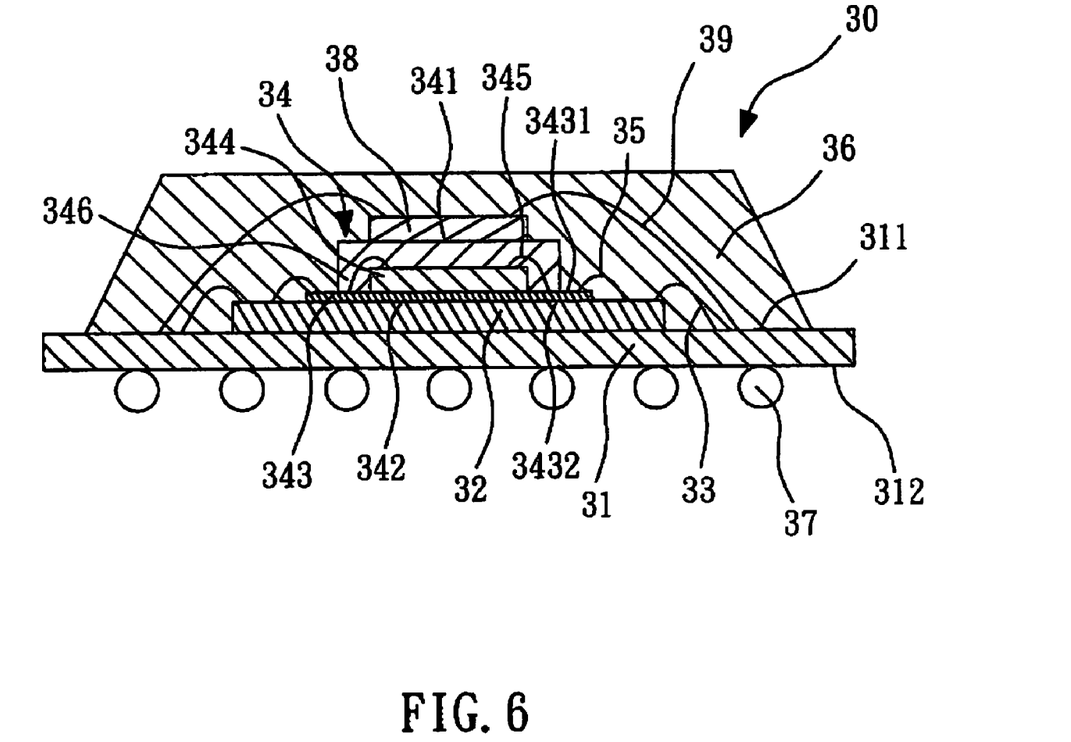
FIG. 6 shows a cross sectional view of a multi-chip package structure according to the fourth embodiment of the present invention.

FIG. 6 shows a cross sectional view of a multi-chip package structure according to the fourth embodiment of the present invention. The multi-chip package structure 30 of the embodiment comprises a first substrate 31, a first chip 32, a plurality of first wires 33, a sub-package 34, a plurality of third wires 35, a first molding compound 36, a plurality of solder balls 37, a third chip 38 and a plurality of fourth wires 39.

The first substrate 31 has a top surface 311 and a bottom surface 312. The first chip 32 is attached to the top surface 311 of the first substrate 31 and is electrically connected to the first substrate 31 by utilizing the first wires 33. It is to be noted that if the first chip 32 is attached to the first substrate 31 by flip-chip, there is no need to dispose the first wires 33.

The sub-package 34 has a top surface 341 and a bottom surface 342. The bottom surface 342 of the sub-package 34 is attached to the first chip 32 by utilizing adhesive glue. The sub-package 34 includes a second substrate 343, a second chip 344, a plurality of second wires 345 and a second molding compound 346.

The second substrate 343 has a top surface 3431 and a bottom surface 3432 and is electrically connected to the first chip 32 by utilizing the third wires 35. The second chip 344 is attached to the top surface 3431 of the second substrate 343 and is electrically connected to the second substrate 343 by utilizing the second wires 345. The second molding compound 346 is used for encapsulating the second chip 344 and part of the top surface 3431 of the second substrate 343. It is to be noted that the second molding compound 346 does not cover the entire top surface 3431 of the second substrate 343. There are a plurality of pads (not shown) disposed on the portion of the top surface 3431 of the second substrate 343 that are not covered by the second molding compound 346 so as to be electrically connected to the third wires 35.

The sub-package 34 is selected from a group consisting of Land Grid Array (LGA) package, Quad Flat Non-leaded (QFN) package, Small Outline Non-leaded (SON) package and Chip On Film package. In this embodiment, the sub-package 34 is a Land Grid Array package whose bottom surface 3432 has a plurality of landing pads for testing. Therefore, the sub-package 34 is adhered to the first chip 32 after being tested so as to raise the yield rate of the multi-chip package structure 30.

The third chip 38 is attached to the top surface 341 of the sub-package 34 and is electrically connected to the first substrate 31 by utilizing the fourth wires 39 or is electrically connected to the first chip 32 by utilizing the fourth wires 39 (not shown).

The first molding compound 36 is used for encapsulating the first chip 32, the sub-package 34, the first wires 33, the third wires 35, the third chip 38, the fourth wires 39 and the top surface 311 of the first substrate 31. The solder balls 37 are formed on the bottom surface 312 of the first substrate 31 so as to be electrically connected to an outer circuit.

The first chip 32, the second chip 344 and the third chip 38 may be optical chip, logic chip, microprocessor chip or memory chip. In this embodiment, the first chip 32 is a microprocessor chip, the second chip 344 is a memory chip and the third chip 38 is another microprocessor chip.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A multi-chip package structure comprising:
    a first substrate having a top surface and a bottom surface;
    a first chip attached to the top surface of the first substrate;
    a plurality of first wires used for electrically connecting the first substrate and the first chip;
    a sub-package having a top surface and a bottom surface, wherein the bottom surface of the sub-package is attached to the first chip directly, the sub-package includes:
        a second substrate having a top surface and a bottom surface, the second substrate being electrically connected to at least one of the first substrate and the first chip;
        a second chip attached to the top surface of the second substrate and electrically connected to the second substrate; and
        a second molding compound used for encapsulating the second chip and part of the top surface of the second substrate; and
    a first molding compound used for encapsulating the first chip, the sub-package and the top surface of the first substrate.

2. The package structure according to claim 1, wherein the sub-package further includes a plurality of second wire used for electrically connected the second substrate and the second chip.

3. The package structure according to claim 1, further comprising a plurality of third wires used for electrically connecting the second substrate and the first chip.

4. The package structure according to claim 1, further comprising a plurality of third wires used for electrically connecting the first substrate and the second substrate.

5. The package structure according to claim 1, further comprising a third chip attached to the top surface of the sub-package and electrically connected to the first substrate.

6. The package structure according to claim 5, further comprising a plurality of a plurality of fourth wires used for electrically connecting the third chip and the first substrate.

7. The package structure according to claim 5, further comprising a heat spreader, the heat spreader comprising a heat spreader body and a supporting portion, wherein the supporting portion extends outwardly and downwardly from the heat spreader body to support the heat spreader body.

8. The package structure according to claim 1, further comprising a heat spreader, the heat spreader comprising a heat spreader and a supporting portion, wherein the supporting portion extends outwardly and downwardly from the heat spreader body to support the heat spreader body.

9. The package structure according to claim 1, further comprising a plurality of solder balls formed on the bottom surface of the first substrate so as to electrically connect to an outer circuit.

10. The package structure according to claim 1, wherein the sub-package is selected from the group consisting of Land Grid Array package, Quad Flat Non-leaded package, Small Outline Non-leaded package and Chip On Film Package.

11. The package structure according to claim 1, wherein the first chip is selected from a group consisting of optical chip, logic chip, microprocessor chip and memory chip.

12. The package structure according to claim 1, wherein the second chip is selected from the group consisting of optical chip, logic chip, microprocessor chip and memory chip.

* * * * *